United States Patent
Iacob

(10) Patent No.: US 6,940,440 B1
(45) Date of Patent: Sep. 6, 2005

(54) SYSTEM AND METHOD FOR DETECTING WHEN AN EXTERNAL LOAD IS COUPLED TO A VIDEO DIGITAL-TO-ANALOG CONVERTER

(75) Inventor: Alin Theodor Iacob, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/692,498

(22) Filed: Oct. 24, 2003

(51) Int. Cl.[7] .............................................. H03M 1/66
(52) U.S. Cl. .................................................... 341/144
(58) Field of Search ........................ 341/118, 120, 121, 341/131, 138, 140, 144; 348/553, 554, 555, 348/558, 571, 372, 725

(56) References Cited

U.S. PATENT DOCUMENTS

| | | | | |
|---|---|---|---|---|
| 5,298,898 A | * | 3/1994 | Brunheim | 341/118 |
| 5,757,298 A | * | 5/1998 | Manley et al. | 341/138 |
| 6,369,737 B1 | * | 4/2002 | Yang et al. | 341/155 |
| 6,411,330 B1 | | 6/2002 | Purcell et al. | 348/180 |
| 6,563,444 B2 | * | 5/2003 | Zhang et al. | 341/120 |

OTHER PUBLICATIONS

"2.7 V to 5.5 V RGB-to-NTSC/PAL Encoder with Load Detect and Input Termination Switch," Analog Devices, Inc., Jan. 2000.

* cited by examiner

Primary Examiner—Brian Young

(57) ABSTRACT

A system and method for determining when an external load is coupled to a digital-to-analog converter (DAC). Specifically, in one embodiment, a load detector circuit comprises a video DAC, an output circuit, a dumping circuit, and a determining circuit. The video DAC comprises a differential architecture including a first output and a second output working in opposite phase. The first DAC output is coupled to the output circuit, which drives the external load. The second DAC output is coupled to a dumping circuit, and is configured such that the dumping circuit is balanced with the output circuit when the external load is present. A determining circuit examines the two outputs of the DAC to determine if the dumping circuit is balanced with the output circuit, and thus if the external load is present.

27 Claims, 6 Drawing Sheets

SYSTEM AND METHOD FOR DETECTING WHEN AN EXTERNAL LOAD IS COUPLED TO A VIDEO DIGITAL-TO-ANALOG CONVERTER

BACKGROUND OF THE INVENTION

1. Field of the Invention

Embodiments of the present invention relate to the field of video digital-to-analog converters. More particularly, embodiments of the present invention relate generally to the detection of an external load on a video digital-to-analog converter.

2. Related Art

Digital video electronic devices (e.g., digital video disk (DVD) players) are designed to output video signals in various analog formats. In this way, various analog video displays are able to present the output video signals using any one of the supported analog formats.

For example, a video electronic device may support the following analog video formats: composite video burst sync (CVBS) signals, S-video signals, and YUV signals, etc. Each of the analog video formats comprises one or more connections that are used for viewing the video signal. For example, one connection is required for CVBS signals, two connections are required for S-video signals, and 3 connections are required for YUV or RGB signals. Display devices (e.g., television) are coupled to the connections to view the video signals in the various formats.

A video digital-to-analog converter (DAC) is coupled to each of the connections that support the various analog video formats. As such, for a video electronic device supporting CVBS, S-video and YUV (or RGB) video signals, six DACs are required to support six connections. Typically, only one format is selected by a user to view the output video signal.

However, in conventional digital video electronic devices all the supporting DACs provide video signals on a continual basis in order to support the various formats. As such, in the video electronic device that supports CVBS, S-video and YUV video signals, all six DACs output video signals, even if only one connection (e.g., CVBS) is used. For those output video signals that are unused, a significant waste of energy is presented. This may become problematic especially, when power is a critical issue, such as, in portable devices.

Conventional systems and methods test for external loads (e.g., display devices) that are coupled to the connectors. In this way, those connectors that are not coupled to external loads can be disabled in an effort to save wasted power. However, these conventional systems and methods rely on generating special test signals used for detecting the presence of an external load. This requires additional circuitry on devices where space may be critical. Also, conventional systems and methods only test for the external load during a small window that is presented in the video output signal. As a result, the conventional systems and methods are complex and prone to latency while waiting for the window of opportunity in the video output signal.

As such, there is a need for a video DAC that is capable of detecting external loads without generating any special test signals, and that is capable of testing for an external load without testing for the external load during a small window in the video output signal.

SUMMARY OF THE INVENTION

Accordingly, various embodiments of the present invention disclose a system and method for determining when an external load is coupled to a video digital-to-analog converter (DAC). Embodiments of the present invention are capable of detecting the external load on a DAC without generating any special test signals. In addition, embodiments of the present invention are capable of detecting an external load on a DAC without waiting for a small testing window in the video output signal.

Specifically, in one embodiment, a system is described for determining when an external load is coupled to a video digital-to-analog converter (DAC). The system is disclosed including a load detector circuit comprising a video DAC, an output circuit, a dumping circuit, and a determining circuit. The video DAC comprises a differential architecture including a first output and a second output working in opposite phase. The output circuit is coupled to the first output, and is configured to receive an external load. The dumping circuit is coupled to the second output, and is configured such that the dumping circuit is balanced with the output circuit when the external load is coupled to the output circuit. A determining circuit examines a first voltage on the first output and a second voltage on the second output to determine if the output circuit is balanced with the dumping circuit.

In another embodiment, a method is disclosed for detecting a load. The method comprises coupling an output circuit to a first output of a video DAC that is enabled. The video DAC comprises a first output and a second output working in opposite phase. The output circuit is configured to receive an external load (e.g., analog display device). The method continues by coupling a dumping circuit to the second output. The dumping circuit is configured such that the dumping circuit is balanced with the output circuit when an external load is coupled to the output circuit. The method then determines if the dumping circuit is balanced with the output circuit to determine if an external load is coupled to the video DAC at the output circuit. The present embodiment is capable of detecting the external load no matter what type of output signal is presented since the testing does not require a window in the video output signal in order to test for the external load.

DETAILED DESCRIPTION OF THE INVENTION

Figure 1:
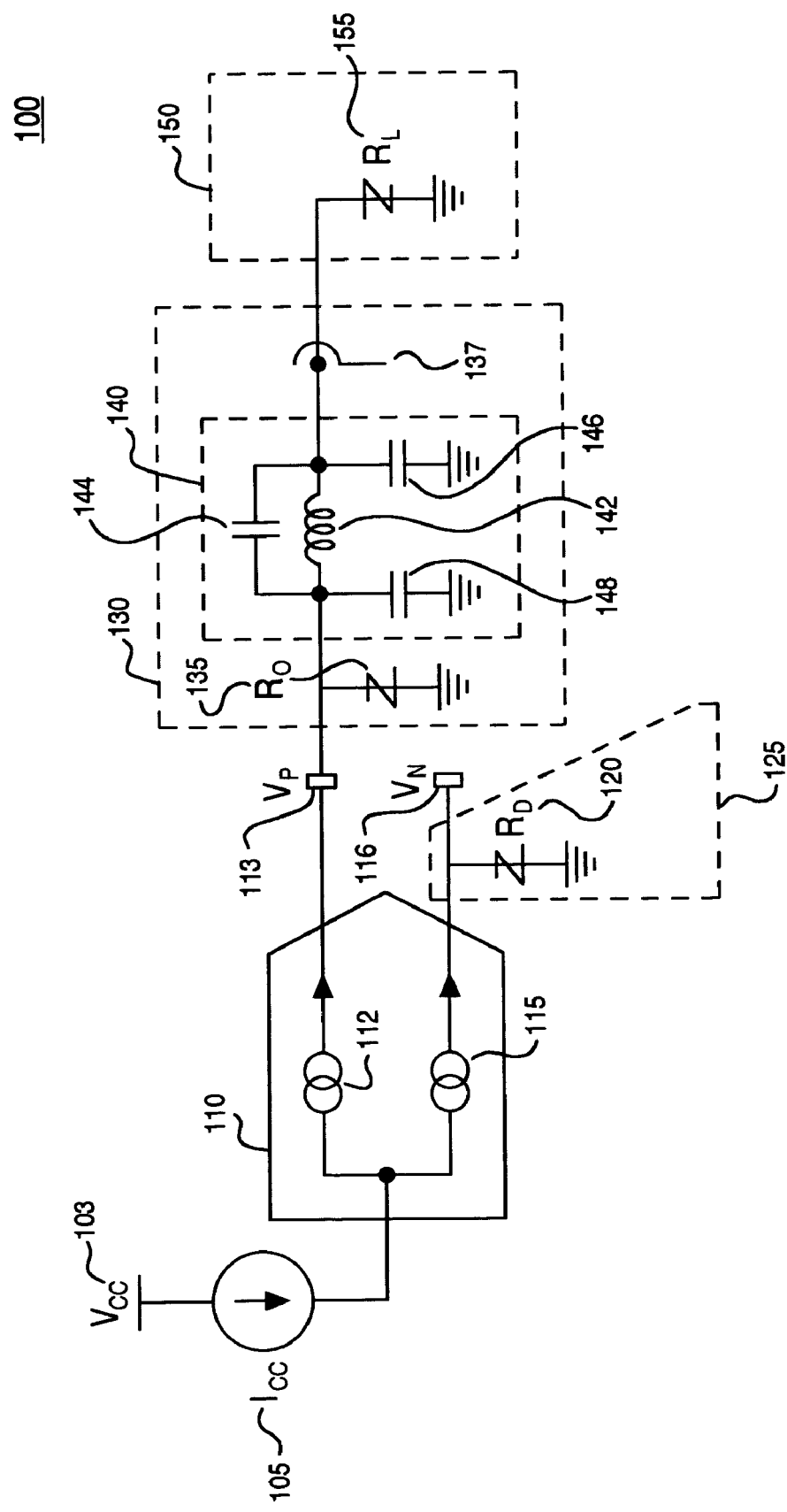
FIG. 1 is a schematic diagram of a load detector that is capable of detecting when an external load is coupled to a video digital-to-analog converter (DAC), in accordance with on embodiment of the present invention.

Reference will now be made in detail to the preferred embodiments of the present invention, a system and method for detecting external loads, examples of which are illustrated in the accompanying drawings.

Accordingly, various embodiments of the present invention disclose a system and method for determining when an external load is coupled to a video digital-to-analog converter (DAC). Embodiments of the present invention are capable of detecting the external load on a DAC without generating any special test signals. In addition, embodiments of the present invention are capable of detecting an external load on a DAC without waiting for a small testing window in the video output signal.

Embodiments of the present invention can be implemented on hardware or software running on an electronic system. The electronic system can be a computer system, an embedded system, a personal computer, notebook computer, server computer, mainframe, networked computer, handheld computer, personal digital assistant, digital video disk (DVD) player, workstation, and the like. In software, this software program is operable for detecting an external load that is coupled to a video DAC. In one embodiment, the computer system includes a processor coupled to a bus and memory storage coupled to the bus. The memory storage can be volatile or non-volatile and can include removable storage media. The computer can also include a display, provision for data input and output, etc.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "coupling," "detecting," "summing," "comparing," "calculating," "determining," "disabling," "enabling," or the like, refer to the action and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Referring now to FIG. 1, an exemplary schematic diagram is disclosed illustrating a load detector system 100 that is capable of detecting when an external load is coupled to a video DAC, in accordance with one embodiment of the present invention. The load detector system 100 is capable of detecting an external load, detecting when there is not an external load coupled to the video DAC, and when the DAC is overloaded. The load detector circuit comprises a video DAC 110, an output circuit 130, and a dumping circuit 125.

The video DAC 110 comprises a first current phase controller 112 and a second current phase controller 115. The first current phase controller 112 is coupled to a first output 113. The second current phase controller 115 is coupled to a second output 116.

The video DAC 110 is coupled to a current generator $I_{CC}$ 105 that is powered by a supply voltage $V_{CC}$ 103. In one embodiment, the supply voltage $V_{CC}$ 103 comprises 3.3 volts. The current generator 105 is coupled to current phase controllers 112 and 115 within the DAC 110.

In the present embodiment, the video DAC 110 comprises a differential architecture. That is, the DAC 110 comprises two outputs, the first output 113 that provides a positive (phase) voltage $V_{Pos}$, and the second output 116 that provides a negative (phase) voltage $V_{Neg}$. In the differential architecture configuration, the voltages $V_{Pos}$ and $V_{Neg}$, at the first output 113 and the second output 116, respectively, have the same wave form and same maximum amplitude, but are opposite in phase. As such, when the loads are identical on the first output 113 and the second output 116, the sum of the voltages $V_{Pos}$ and $V_{Neg}$—is constant at any time and presents an approximate direct current (DC) voltage.

The output circuit 130 is coupled to the first output 113. The output circuit 130 is configured to drive an external load, such as, external load 150. For example, the external load is a display device, such as, a television. By convention, the external load is represented by an external load resistor $R_L$ that is set to 75 Ohms.

In the present embodiment, the output circuit 130 is comprised of an output resistor $R_O$ 135 coupled to the first output 113 and to ground. The output resistor $R_O$ 135 is coupled to a filter 140. The filter 140 is coupled to a connector 137. The filter 140 is an example of a single stage "PI" filter and comprises an inductor 142, and a capacitor 144. Capacitors 148 and 146 are coupled to either end of the inductor 142 and to ground.

The dumping circuit 125 is coupled to the second output 116. The dumping circuit comprises a resistor $R_D$ 120 coupled to the second output 116 and to ground. The dumping circuit 125 is configured such that the dumping circuit 125 is balanced with the output circuit 130 when the external load 150 is coupled to the output circuit 130.

Figure 2:
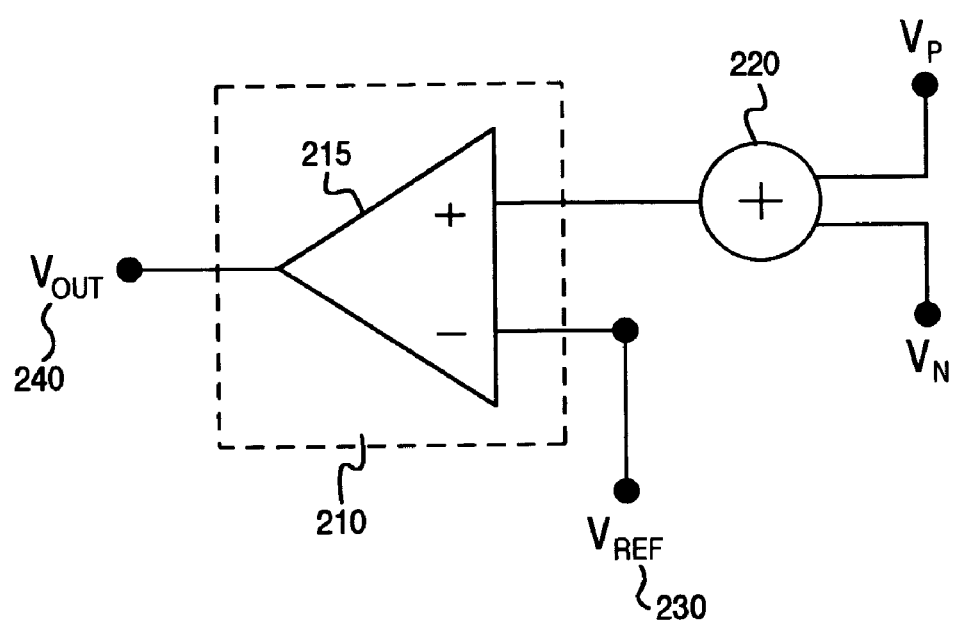
FIG. 2 is a schematic diagram of a determining circuit that is included within a load detecting circuit, in accordance with one embodiment of the present invention.

FIG. 2 is a schematic diagram of a determining circuit 200. In one embodiment, the determining circuit 200 is included within the load detecting circuit 100. The determining circuit 200 comprises a comparator 210 and a summing circuit 220. In one embodiment the comparator 210 is comprised of an operational amplifier 215.

The determining circuit 200 examines a first voltage $V_{Pos}$ and a second voltage $V_{Neg}$ to determine if the dumping circuit 125 is balanced with the output circuit 130. More specifically, when an external load 150 is coupled to the connector 137, the load seen at the first output 113 is the two resistors $R_O$ 135 and $R_L$ 155 in parallel. By setting the value of the output resistor $R_O$ 135 also to 75 Ohms, a resultant resistance value of $R_O$ 135 and $R_L$ 155 in parallel is approximately 37.5 Ohms.

In order to provide balance between the voltages $V_{Pos}$ and the $V_{Neg}$, the resistor $R_D$ 120 in the dumping circuit is also set approximately to 37.5 Ohms. In that way, when the external load resistor $R_L$ 155 is present, both the loads seen at the first output 113 and the second output 116 are balanced and equal approximately to 37.5 Ohms.

As such, when the external load resistor $R_L$ 155 is present, the sum of $V_{Pos}$ and $V_{Neg}$, as provided by the summing circuit 220, provides an approximately constant DC voltage value. In the case of FIG. 1, the approximate constant DC voltage value when $V_{Pos}$ and $V_{Neg}$ are summed is approximately a constant 1.3 volts. The summed value of $V_{Pos}$ and $V_{Neg}$ is independent of the amplitude, type, etc. of the video signal provided by the DAC 110.

Thereafter, the comparator 210 determines if the summed value of $V_{Pos}$ and $V_{Neg}$ is equal to a reference voltage $V_{ref}$ of 1.3 volts. When the summed value of $V_{Pos}$ and $V_{Neg}$ is equal to $V_{ref}$, then the dumping circuit 125 is balanced with the output circuit 130 that includes the external load 150. As such, the comparator 210 outputs a logical signal at $V_{out}$ 240 that indicates there is an external load 150 coupled to the DAC 100.

On the other hand, when there is no external load 150 coupled to the DAC 110, then the dumping circuit 125 is not balanced with the output circuit 130, and therefore the summed value of $V_{Pos}$ and $V_{Neg}$ is not equal to $V_{ref}$. In this case, the resulting signal of the sum of $V_{Pos}$ and $V_{Neg}$ comprises both a DC component and an alternating current AC component. As such, the summed value of $V_{Pos}$ and $V_{Neg}$ is not equal to the $V_{ref}$ voltage 230, and the comparator 210 will output a logical signal $V_{out}$ that represents that no external load 150 is coupled to the DAC 110. In one embodiment, the resulting signal of the sum of $V_{Pos}$ and $V_{Neg}$ is approximately equal to 1.7 volts, which is greater than the $V_{ref}$ voltage 230 and indicates that the external load 150 is not present.

In addition, a controller (e.g., a central processing unit) that is not shown, disables the video DAC when the external load 150 is not detected, that is, when the external load is not coupled to the DAC 110, in one embodiment. In another embodiment, the CPU periodically enables the DAC 110 to check to see if an external load 150 is present and coupled to the DAC 110 in the interim period, using the system 100, as previously described in full.

While the present embodiment of FIG. 2 describes a determining circuit 200, other embodiments of the present invention are well suited to determining circuits that are comprised solely of a comparator (not shown). The comparator compares the $V_{Pos}$ signal at the first output 113 with the $V_{Neg}$ signal at the second output 116 to determine solely from these two signals whether there is a load detected on the output circuit 130 associated with the DAC 110 of FIG. 1.

Figure 3:
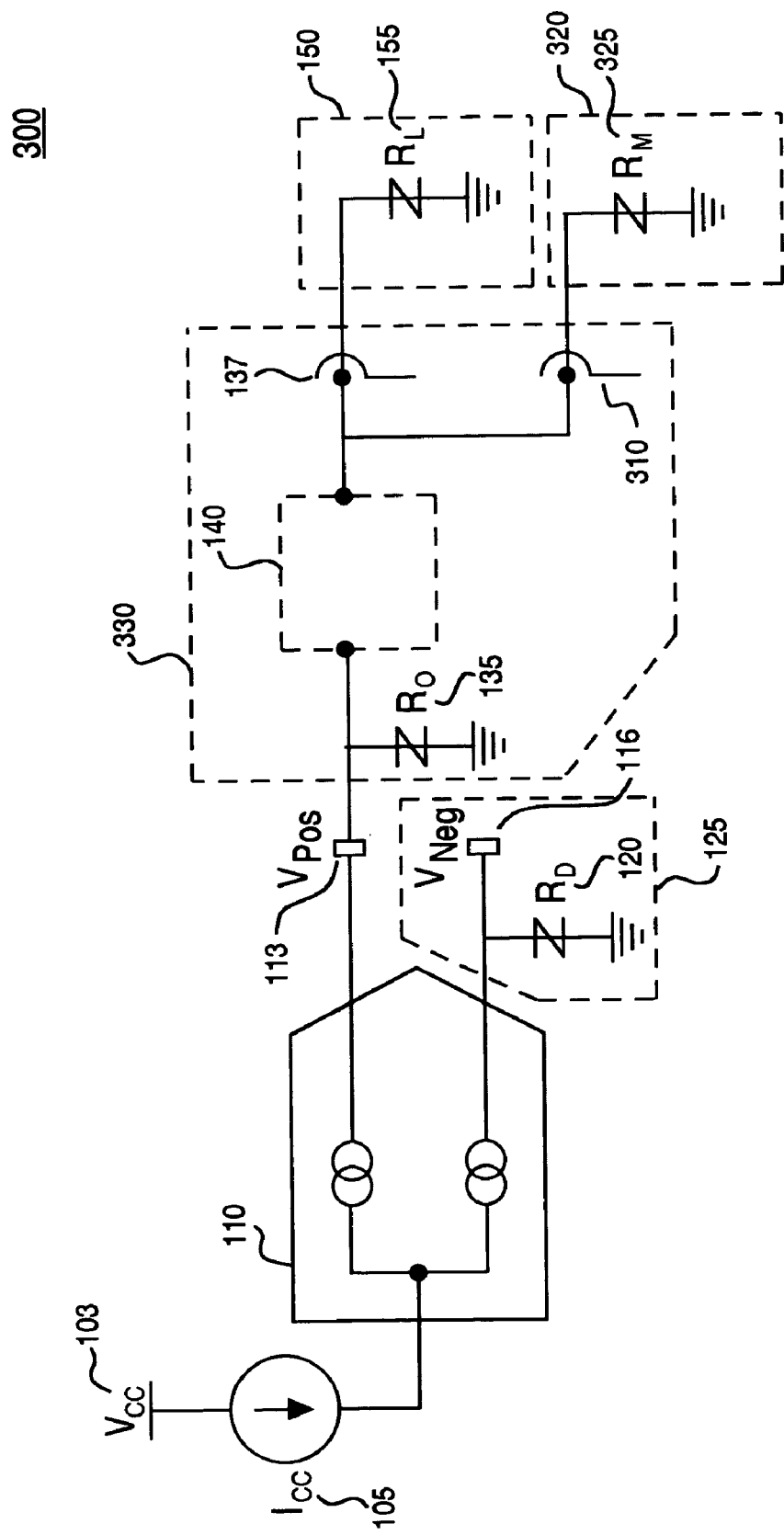
FIG. 3 is a schematic diagram of a load detecting circuit that is capable of detecting when a digital-to-analog converter is overloaded, in accordance with one embodiment of the present invention.

FIG. 3 is a schematic diagram of a load detecting circuit 300 that is capable of detecting when the DAC 110 is overloaded. The load detection circuit 300 is similarly configured substantially as the load detection circuit 100 of FIG. 1. Similarly numbered components are identical in the FIG. 1 and FIG. 3. As such, the load detection circuit 300 comprises a video DAC 110, a first output 113, a second output 116, a filter 140, and a connector 137. The connector 137 is configured to receive the external load 150.

Additionally, the load detection circuit 300 supports a second connector 310. The second connector 310 is configured to support a second external load 320. Both the connector 137 and connector 310 are coupled to filter 140. This is possible when two video formats share the same signal, such as, the Y signal supported by both the YUV standard and the S-video standard. To save cost, the same Y signal is wired to two different video outputs (one for YUV plugs and one for the S-video plugs).

However, a problem arises when the user makes both connections to the DAC 110. In that case, the load on the output circuit 330 would not be balanced with the load $R_D$ 120 on the dumping circuit 125. When the load detection circuit 300 is overloaded, the load on the output circuit 330 is less than 37.5 Ohms. For example, in FIG. 3, the resistor $R_L$ 155 in the external load 150, the resistor $R_M$ 325 in the external load 320, and the resistor $R_O$ 135 are coupled in parallel. If the values of $R_O$ 135, $R_L$ 155, and $R_N$ is the standard 75 Ohms, then the total resistance for the output circuit 330 is approximately 25 Ohms, when the DAC 110 is overloaded.

As a result, the sum of the voltages at $V_{Pos}$ and $V_{Neg}$ will be less than the voltage at $V_{ref}$ 230 of FIG. 2. This indicates that the output circuit 330 and the dumping circuit 125 are not in balance. Since the sum of the voltages for $V_{Pos}$ and $V_{Neg}$ is less than the $V_{ref}$ 230, this indicates that there is an overload on the DAC 110, and that two plugs are connected to the output circuit 330, when only one plug is supported.

In one embodiment, when the load detection circuit 300 determines that the DAC 110 is overloaded, a controller (e.g., CPU, not shown) will present a warning to the user indicating that the overload exists.

Figure 4:
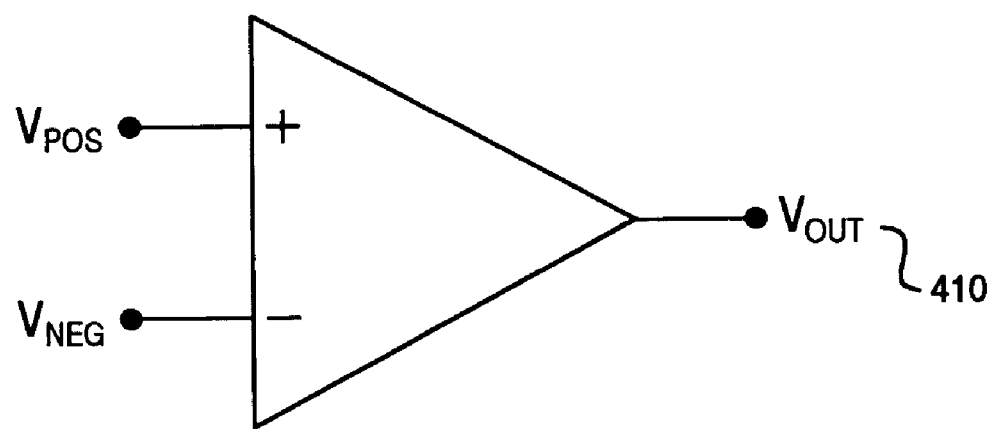
FIG. 4 is a schematic diagram of a comparator circuit that is used to determine if an external load is present, in accordance with one embodiment of the present invention.

FIG. 4 is a schematic diagram of a comparator circuit 400 used to determine if a load detection circuit (e.g. load detection circuit 100) has an external load coupled to the DAC, in accordance with one embodiment of the present invention. In FIG. 4, instead of using a summing circuit and a comparator, as in FIG. 2, only a comparator circuit 400 is used.

In FIG. 4, the voltage signals $V_{Pos}$ and the $V_{Neg}$ are provided as inputs to the comparator 400. When the voltage signals $V_{Pos}$ and $V_{Neg}$ are equal, the load detection circuit is balanced. That is, in FIG. 1, the output circuit 130 is balanced with the dumping circuit 125.

For the comparator 400 to support the load detection circuit 100, for example, the load detection circuit operates at half scale, such that the two outputs $V_{Pos}$ and $V_{Neg}$ generate equal levels, in one embodiment. In this case, when $V_{Pos}$ and $V_{Neg}$ are equal, and are at half scale, their value is 0.65 volts, normally. If there is no external load on the DAC 110, then the load is 75 Ohms, instead of the 37.5 Ohms. As a result, the voltage $V_{Pos}$ becomes $(1/2)$ $(I_{full\ scale})$ (75 Ohms), or 1.3 volts. As a result, $V_{Pos}$ at 1.3 volts is greater than $V_{Neg}$ at 0.65 volts, which indicates that the output circuit 130 is not balanced with the dumping circuit 125, and that no external load 150 is detected.

Also, the comparator may have a window with two limits, L1 and L2. If the value is within the window, the two outputs are balanced. If the value is outside the window, than the connector output is either unloaded or overloaded. In practical implementations, a window comparator comprises two simple comparators, each of them having a single limit, and a logic circuit to determine the one of the three possible load conditions.

Figure 5:
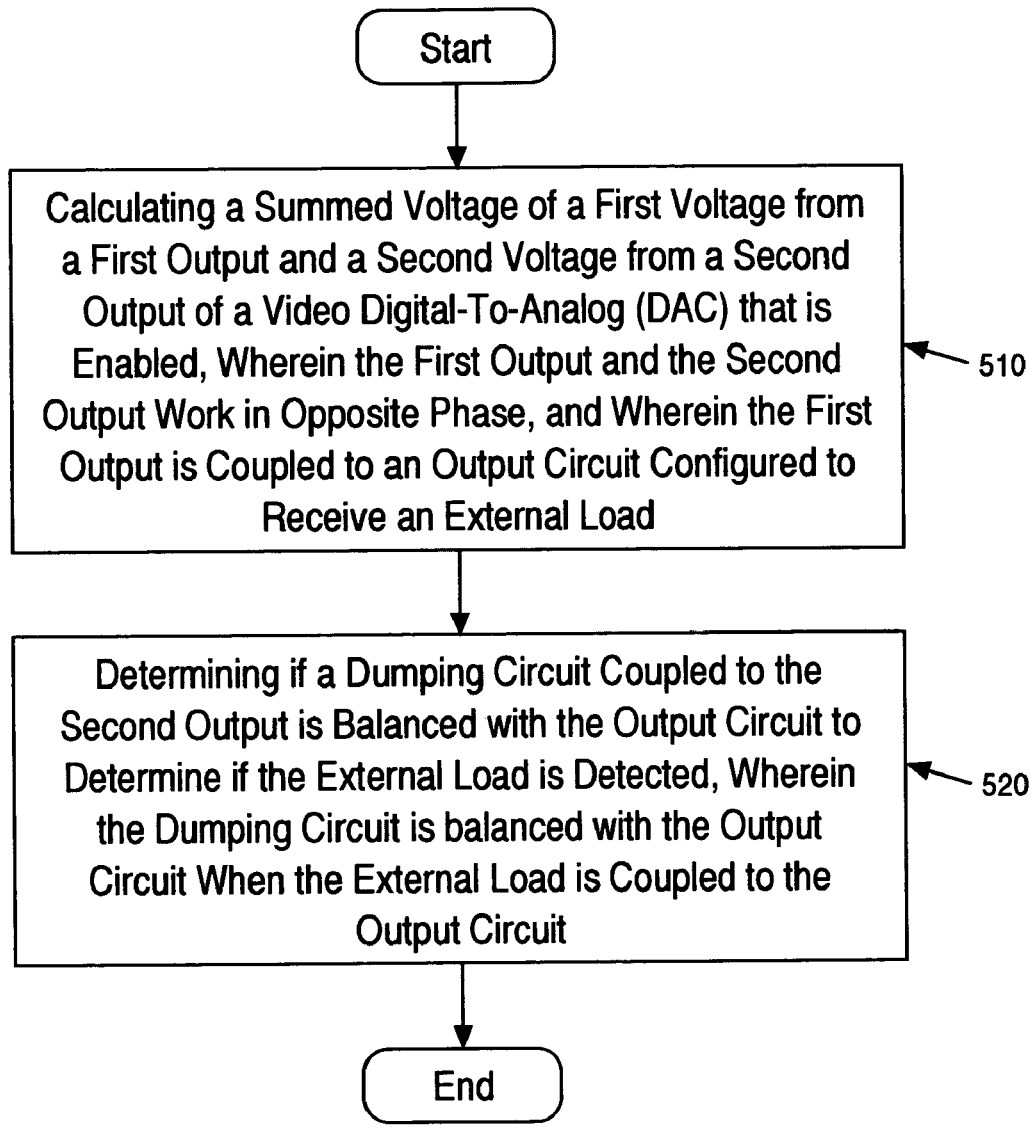
FIG. 5 is a flow chart illustrating steps in a method for detecting the presence of an external load connected to a video digital-to-analog converter, in accordance with one embodiment of the present invention.

Now referring to FIG. 5, a flow chart 500 is disclosed illustrating steps in a method for detecting an external load on a video DAC, in accordance with one embodiment of the present invention. The method is capable of detecting an external load independent of signal type, amplitude, and features (e.g., testing during a window).

The present embodiment begins by calculating a summed voltage of a first voltage from a first output and a second voltage from a second output of a video digital-to-analog (DAC) that is enabled, at 510. The video DAC comprises the first output and the second output working in opposite phase, such as, in a differential architecture.

In addition, the first output is coupled to an output circuit that is configured to receive an external load, such as, a display device. The output circuit comprises the output circuit 130 in FIG. 1, for example, in one embodiment.

At 520, the present embodiment determines if a dumping circuit coupled to the second output is balanced with the output circuit to determine if the external load is detected. The dumping circuit is balanced with the output circuit when the external load is coupled to the output circuit. That is, the summed voltage is constant, in one embodiment. In another embodiment, the load on the dumping circuit is equal to the load on the output circuit. When the dumping circuit is balanced with the output circuit, the external load is coupled to the output circuit. On the other hand, when the dumping circuit is not balanced with the output circuit, the external load is not coupled to the output circuit.

In one embodiment, detection of the external load is determined by comparing the summed voltage to a direct current (DC) reference voltage. That is, when the dumping circuit is balanced with the output circuit, the summed voltage is equal to the DC reference voltage. In this case, the summed voltage substantially comprises a DC component only.

The present embodiment determines that the dumping circuit is not balanced with the output circuit when the summed voltage is not equal to the DC reference voltage. That is, the summed voltage comprises a DC component and an AC component. In one embodiment, the summed voltage is greater than the DC reference voltage when the dumping circuit is not balanced with the output circuit.

In another embodiment, an overload of the DAC is detected. In this case, the first output is overloaded by the external load and another external load. The embodiment determines that the first output is overloaded when the first voltage is less than the second voltage.

In another embodiment, the first voltage at the first output is directly compared with the second voltage at the second output to determine if an external load is detected. When an external load is detected, the first voltage is equal to the second voltage, and the output circuit is balanced with the dumping circuit. On the other hand, when no external load is detected, the first voltage is not equal to the second voltage, and the output circuit is not balanced with the dumping circuit.

In still another embodiment, when no external load is detected on the DAC, and therefore when the dumping circuit is not balanced with the output circuit, the video DAC is disabled. As such, the video DAC is disabled in order to save power.

Periodically, the video DAC is enabled to determine if an external load is coupled to the output circuit. That is, an external load may have been coupled in the interim period, after it was first detected that no external load existed. Enablement of the video DAC allows for the method of flow chart 500 to be implemented to determine if the external load is coupled to the DAC.

Figure 6:
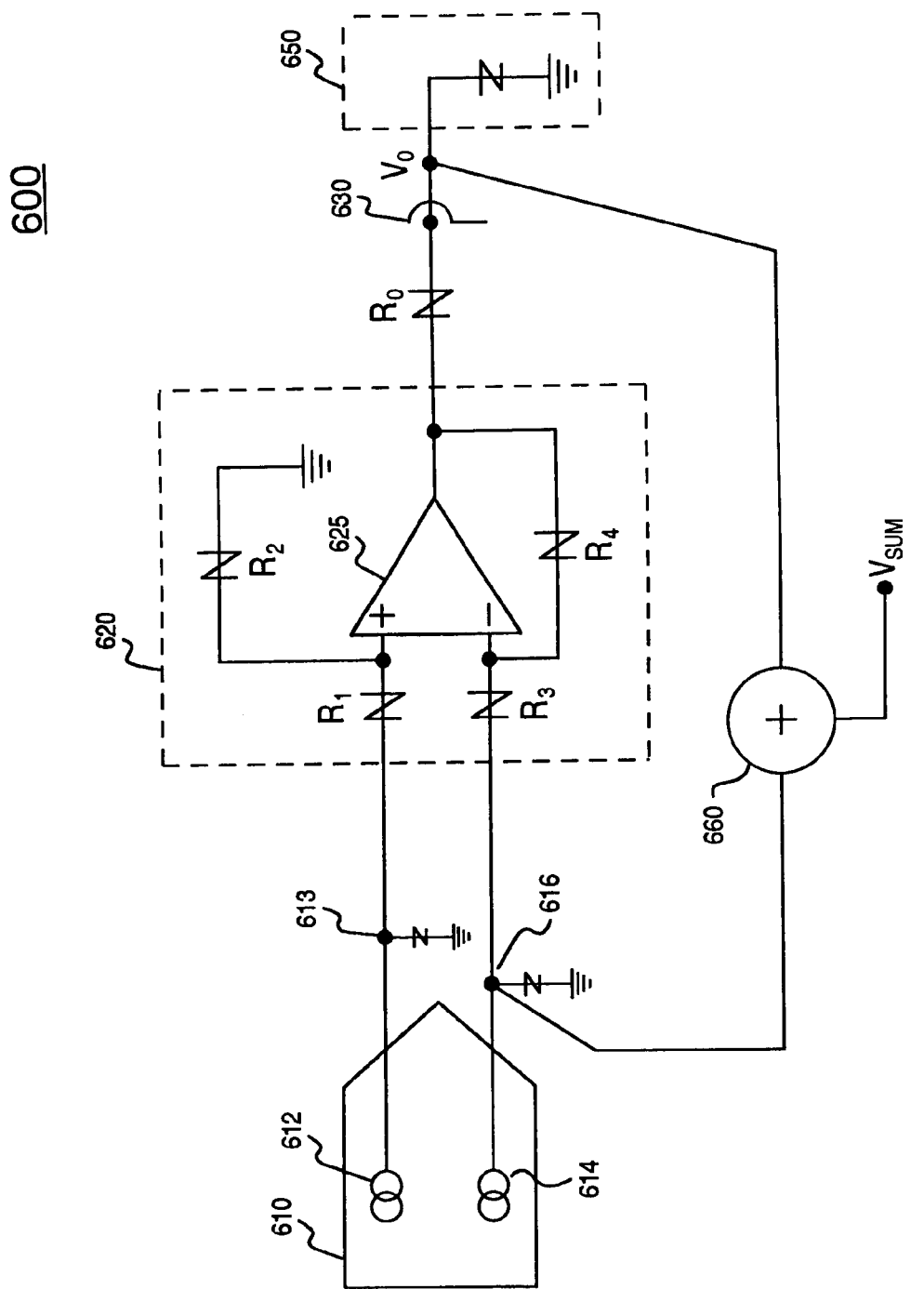
FIG. 6 is a schematic diagram of a load detection circuit that includes a buffer, in accordance with one embodiment of the present invention.

FIG. 6 is a schematic diagram of a load detection circuit 600 that includes a buffer, in accordance with one embodiment of the present embodiment. The buffer is necessary when using long cabling between the external load 650 and the DAC 610. The load detection circuit 600 is capable of detecting an external load 650 even when a buffer 620 is present.

The load detection circuit 600 comprises a video DAC 610, a buffer 620, an external load 650, and a summing circuit 660. The video DAC 610 comprises a first output 613 with a voltage $V_{Pos}$ and a second output 616 with a voltage $V_{Neg}$. The video DAC is configured as a differential architecture, such that the first $V_{Pos}$ and $V_{Neg}$ are opposite in phase, but have the same maximum amplitude and wave form. That is, the current summed from the current generators 612 and 614 is always constant at full scale.

The load detection circuit 600 also comprises a buffer circuit 620 that is coupled to the first output 613 and the second output 616. The buffer circuit 620 comprises two resistors $R_1$ and $R_2$ coupled in series to the first output. A positive voltage $V_+$ is split from the two resistors, $R_1$ and $R_2$ and provided as an input to the non-inverting input of the operational amplifier 625 of the buffer 620. The buffer circuit 620 also comprises two resistors $R_3$ and $R_4$ coupled in series to the second output. A negative voltage V is split from the two resistors $R_3$ and $R_4$. In addition, resistor $R_4$ provides a feedback between the inverting input and an output $V_A$ of the operational amplifier 625. In one embodiment, the resistors $R_1$, $R_2$, $R_3$, and $R_4$ are equal in value.

The buffer circuit has a very low output resistance. In order to match the load resistance, a series resistor $R_0$ is added between the output of the buffer circuit and the connector 630. The connector is configured to receive an external load 650. The external load 650 is, for example, a display device, and is represented by its input resistance of 75 Ohms.

The second output 616 provides the negative voltage ($V_{Neg}$, in phase) directly from the DAC. A summing circuit sums the output voltage $V_O$ from the output at the connector 630 and $V_{Neg}$ from the second output.

As such, when an external load is present, the summed voltage ($V_{Sum}=V_O+V_{Neg}$) is equal to one half of the full scale voltage ($V_{Full\ Scale}=V_{Pos}+V_{Neg}$) from the DAC 610, which is a DC voltage. More specifically, when an external load is present, $V_O=(1/2)V_A$, where $V_A=(V_{Pos}-V_{Neg})$ $=2V_{Pos}-V_{Full\ Scale}$, since $V_{Neg}=V_{Full\ Sclae}-V_{Pos}$. As a result, $V_{Sum}=V_O-V_{Neg}=$ (1/2) $(2V_{Pos}-V_{Full\ Scale})-V_{Neg})=(1/2)$ $V_{Full\ Scale}$. Thus, when a load is present, in a load detection circuit 600 with a buffer, the summed voltage $V_{Sum}$ is equal to one half of full scale.

On the other hand, when an external load is not present, the summed voltage ($V_{Sum}=V_O+V_{Neg}$) comprises a DC component as well as an AC component. As such, $V_O=2V_{Pos}-V_{Full\ Scale}$. As a result, the summed voltage $V_{Sum}$ is equal to $V_{Pos}$. Specifically, $V_{Sum}=V_O-V_{Neg}=2V_{Pos}-V_{Full\ Scale}-V_{Neg}=V_{Pos}$, since $V_{Neg}=V_{Full\ Sclae}-V_{Pos}$.

Accordingly, various embodiments of the present invention disclose a system and method determining when an external load is coupled to a video DAC. As an advantage over the prior art, the present invention is capable of detecting the presence of an external load on a DAC without generating any special test signals. That is, more specifically, the external load is detected independent of amplitude, features, and type of a video signal. In addition, embodiments of the present invention are capable of detecting an external load on a DAC without waiting for a small testing time window in the video output signal.

While the method of the embodiment illustrated in flow chart 500 shows specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a system and method for detection of an external load on a video DAC are described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed is:

1. A load detector circuit system, comprising:
   a digital-to-analog converter (DAC) comprising a differential architecture comprising a first output and a second output working in opposite phase;
   an output circuit coupled to said first output, said output circuit configured to drive an external load;
   a dumping circuit coupled to said second output configured such that said dumping circuit is balanced with said output circuit when said external load is coupled to said output circuit; and
   a determining circuit for examining a first voltage on said first output and a second voltage on said second output to determine if said dumping circuit is balanced with said output circuit, wherein said determining circuit further comprises:
      an adding circuit to calculate a summed voltage of said first voltage and said second voltage; and
      a comparator for comparing said summed voltage to a reference voltage.

2. The load detector circuit of claim 1, wherein said reference voltage comprises a direct current (DC) voltage.

3. The load detector circuit of claim 1, wherein said reference voltage comprises a fixed DC level.

4. The load detector circuit of claim 1, wherein said summed voltage comprises a constant DC value and essentially equals said reference voltage when said external load is coupled to said output circuit.

5. The load detector circuit of claim 1, wherein said summed voltage does not equal said reference voltage and comprises a DC component and an AC component when said external load is not coupled to said output circuit.

6. The load detector circuit of claim 1, wherein said determining circuit uses the presence of a DC component in said summed voltage to determine that said external load is present.

7. The load detector circuit of claim 1, wherein said determining circuit uses the presence of an AC component in said summed voltage to determine that said external load is not present.

8. The load detector circuit of claim 1, wherein said output circuit comprises:
   a resistor coupled to said first output and to ground;
   a filter coupled to said first output; and
   a connector coupled to said filter, wherein said connector is configured to receive said external load.

9. The load detector circuit of claim 8, wherein said resistor in parallel with a load resistance associated with said external load are balanced with a second resistance associated with said dumping circuit.

10. The load detector circuit of claim 1, wherein said determining circuit examines said first voltage and said second voltage independently of video content on said video DAC.

11. The load detector circuit of claim 1, further comprising:
    a controller for disabling said video DAC when said external load is not coupled to said output circuit.

12. A method for detecting a load, comprising:
    a) calculating a summed voltage of a first voltage from a first output and a second voltage from a second output of a digital-to-analog converter (DAC) that is enabled, wherein said first output and said second output work in opposite phase, and wherein said first output is coupled to an output circuit configured to receive an external load; and
    b) determining if a dumping circuit coupled to said second output is balanced with said output circuit to determine if said external load is present, wherein said dumping circuit is balanced with said output circuit when said external load is coupled to said output circuit.

13. The method of claim 12, wherein said c) comprises:
    comparing said summed voltage to a direct current (DC) reference voltage.

14. The method of claim 13, further comprising:
    determining said dumping circuit is balanced with said output circuit when said summed voltage substantially comprises a DC component and is equal to said DC reference voltage.

15. The method of claim 13, further comprising:
    determining said dumping circuit is not balanced with said output circuit when said summed voltage is not equal to said DC reference voltage, wherein said summed voltage comprises a DC component and an alternating current (AC) component.

16. The method of claim 15, wherein said summed voltage is greater than said DC reference voltage when said dumping circuit is not balanced with said output circuit.

17. The method of claim 13, further comprising:
    d) determining if said first output is overloaded by said external load and another external load, when said first voltage is less than said second voltage.

18. The method of claim 12, wherein said c) comprises:
    comparing a first voltage at said first output and a second voltage at said second output.

19. The method of claim 12, further comprising:
    d) disabling said DAC when said dumping circuit is not balanced with said output circuit.

20. The method of claim 18, further comprising:
    e) enabling said DAC that is disabled to determine if said external load is coupled to said output circuit.

21. A load detector circuit, comprising:
    a digital-to-analog converter (DAC) comprising a differential architecture comprising a first output and a second output working in opposite phase;
    a buffer circuit coupled to said first output and said second output of said video DAC, said buffer circuit comprising a buffer output coupled to a resistor and a connector in series, wherein said connector is configured to receive an external load;

a summing circuit for calculating a summed voltage of a first voltage at said connector and a second voltage at said second output; and a comparator circuit for determining when said summed voltage indicates said external load is present.

22. The load detector circuit of claim 21, wherein said buffer circuit further comprises:

an operational amplifier comprising a non-inverting input, an inverting input, and said buffer output, wherein said non-inverting input is coupled to a first resistor and said first output in series, and wherein said inverting input is coupled to a third resistor and said second output in series;

a second resistor coupled to said non-inverting input and to ground; and a feedback resistor coupled to said inverting input and to said buffer output.

23. The load detector circuit of claim 21, wherein said comparator circuit determines said external load is present when said summed voltage equals one half of a full scale voltage, wherein said full scale voltage comprises the sum of said second voltage and an output voltage at said first output.

24. The load detector circuit of claim 21, wherein said comparator circuit determines said external load is not detected when said summed voltage equals a output voltage at said first output.

25. The load detector circuit of claim 21, wherein said DAC comprises a video DAC.

26. A load detector circuit system, comprising:

a digital-to-analog converter (DAC) comprising a differential architecture comprising a first output and a second output working in opposite phase;

an output circuit coupled to said first output, said output circuit configured to drive an external load;

a dumping circuit coupled to said second output configured such that said dumping circuit is balanced with said output circuit when said external load is coupled to said output circuit; and a determining circuit for examining a first voltage on said first output and a second voltage on said second output to determine if said dumping circuit is balanced with said output circuit, wherein said determining circuit comprises:

a comparator for comparing said first voltage and said second voltage, such that said first voltage is equal to said second voltage when said output circuit and said dumping circuit is balanced.

27. The load detector circuit system of claim 26, wherein said comparator is driven to half scale.

* * * * *